US007930160B1

(12) United States Patent
Hosagrahara et al.

(10) Patent No.: US 7,930,160 B1
(45) Date of Patent: Apr. 19, 2011

(54) ELECTRONIC MARKUP OF EXECUTABLE MODELS

(75) Inventors: Arvind S. Hosagrahara, Novi, MI (US); Paul F. Smith, Milan, MI (US)

(73) Assignee: The MathWorks, Inc., Natick, MA (US)

( * ) Notice: Subject to any disclaimer, the term of this patent is extended or adjusted under 35 U.S.C. 154(b) by 1011 days.

(21) Appl. No.: 11/647,577

(22) Filed: Dec. 29, 2006

(51) Int. Cl.
*G06F 17/50* (2006.01)
(52) U.S. Cl. ............................................. 703/13; 703/14
(58) Field of Classification Search .................... 703/14; 717/105, 109
See application file for complete search history.

(56) References Cited

U.S. PATENT DOCUMENTS 1,117,184 A 11/1914 Goldberg
5,347,295 A 9/1994 Agulnick et al.

OTHER PUBLICATIONS

Ahern "Using Online Annotation Software to Provide Timely Feedback in an Introductory Programming Course." 35th ASEE/IEEE Frontiers in Education Conference. Oct. 19-25, 2005.*
T.L. Dimond, "Devices for Reading Handwritten Characters," Proceedings of the Eastern Joint Computer Conference, Washington, DC, Dec. 1957, pp. 232-237.
L.D. Harmon, "Handwriting Reader Recognizes Whole Words," Electronics Magazine, Aug. 24, 1962, pp. 29-31.
Newman et al., "Principles of Interactive Computer Graphics," McGraw Hill, Inc., 1973, pp. 575-582.
"The Byte Awards: Second Annual Byte Award Winners," Byte Magazine, vol. 15, No. 1, Jan. 12, 1990, pp. 285-296.
Pavlovic, et al., "Visual Interpretation of Hand Gestures for Human-Computer Interaction: A Review," IEEE Transactions on Pattern Analysis and Machine Intelligence, vol. 19, No. 7, Jul. 1997.
Del Vecchio, et al., "Decomposition of Human Motion into Dynamics Based Primitives with Application to Drawings Tasks," Cal. Tech, Division of Engineering, (available http://www.cds.caltech.edu/~murray/papers/2002f_dmp02-automatica.html).
Fraser, http://neil.fraser.name/software/recog/, Jan. 28, 2001.
T.O. Ellis, "The GRAIL Project: An Experiment in Man-Machine Communications," The RAND Corporation, RM-5999-ARPA, Santa Monica, California, Sep. 1969 (hereinafter Ellis).

* cited by examiner

*Primary Examiner* — Kamini S Shah
*Assistant Examiner* — Saif A Alhija
(74) *Attorney, Agent, or Firm* — Venable LLP; Michael A. Sartori; Kyle D. Petaja

(57) ABSTRACT

A computer-implemented method for marking-up an executable model includes: displaying the executable model; associating an electronic overlay with the executable model, the electronic overlay operating with the executable model without changing the contents of the executable model; and indicating an electronic markup to the executable model using the electronic overlay wherein the electronic markup affects functionality of the executable model when the executable model is executed with the electronic overlay.

49 Claims, 13 Drawing Sheets

ELECTRONIC MARKUP OF EXECUTABLE MODELS

BACKGROUND

Tools exist for producing computer-implemented graphical models, such as graphical block element based models, for example, and/or non-graphical models, such as text-based models that may be executable, for example, by means of numerical simulation. Using the tools, models are created, edited, and may be executed within a computing system. However, inspection, review, and annotation of these models may take place primarily outside of the computing system. For example, models may be printed as hard copies on paper and marked-up by hand. Changes annotated on the hard copy of the model are used to edit the electronic version of the model, with the user/human editor referring back and forth between the screen on which the model is displayed and the hard copy. To test changes made to a model, the electronic version needs to be changed, often with a duplicate copy being made for each set of changes being tested. If more review is needed after an initial round of changes, the model will need to be printed out once again and reviewed again as described above.

SUMMARY

One embodiment includes a computer-implemented method for marking-up an executable model. The method includes displaying the executable model; associating an electronic overlay with the executable model, the electronic overlay operating with the executable model without changing the executable model; and indicating an electronic markup to the executable model using the electronic overlay, wherein the electronic markup affects functionality of the executable model when the executable model is executed with the electronic overlay.

One embodiment includes a computer-readable medium comprising software, which when executed by a computer system causes the computer system to perform operations for marking-up an executable model. The operations include displaying the executable model; associating an electronic overlay with the executable model, the electronic overlay operating with the executable model without changing the contents of the executable model; indicating an electronic markup to the executable model using the electronic overlay, wherein the electronic markup affects functionality of the executable model when the executable model is executed with the electronic overlay.

One embodiment includes a system for marking-up an executable model in an executable modeling environment. The system includes means for displaying the executable model; means for associating an electronic overlay with the executable model, the electronic overlay operating with the executable model without changing the contents of the executable model; and means for indicating an electronic markup to the executable model using the electronic overlay, wherein the electronic markup affects functionality of the executable model when the executable model is executed with the electronic overlay.

Further features of the invention, as well as the structure and operation of various embodiments of the invention, are described in detail below with reference to the accompanying drawings.

BRIEF DESCRIPTION OF THE DRAWINGS

The foregoing and other features of the invention will be apparent from the following, more particular description of exemplary embodiments of the invention, as illustrated in the accompanying drawings wherein like reference numbers generally indicate identical, functionally similar, and/or structurally similar elements. The left most digits in the corresponding reference number indicate the drawing in which an element first appears.

DEFINITIONS

Figure 1:
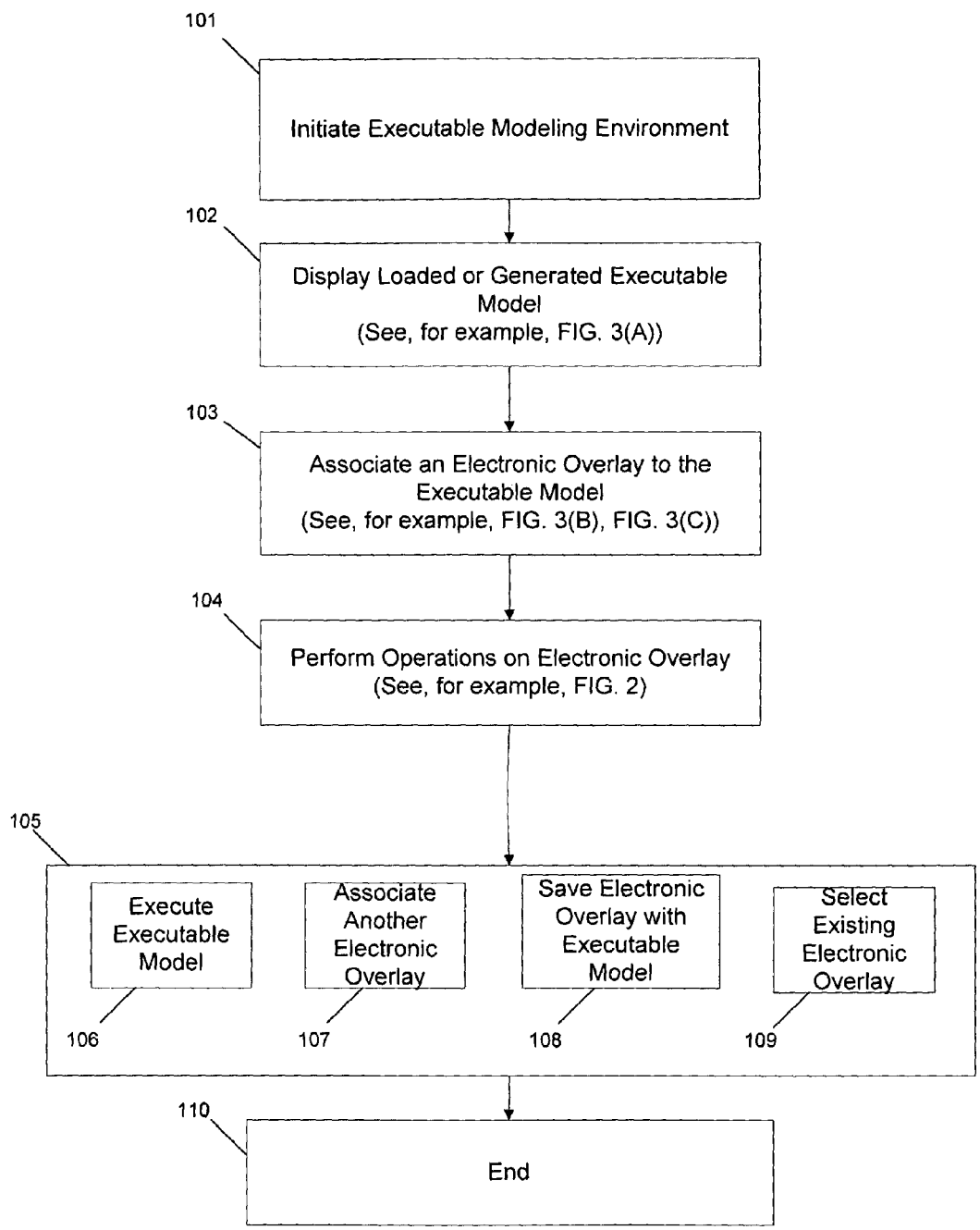
FIG. 1 depicts an exemplary flowchart for an exemplary electronic markup system.

In describing the invention, the following definitions are applicable throughout (including above).

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a tablet PC; a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, or a chip set; a System on Chip (SoC) and a Multiprocessor System-on-Chip (MPSoC); an optical computer; a quantum computer; a biological computer; and an apparatus that may accept data, may process data in accordance with one or more stored software programs, may generate results, and typically may include input, output, storage, arithmetic, logic, and control units.

"Software" may refer to prescribed rules to operate a computer. Examples of software may include: software; code segments; instructions; applets; pre-compiled code; compiled code; computer programs; executable models; and programmed logic.

A "computer-readable medium" may refer to any storage device used for storing data accessible by a computer. Examples of a computer-readable medium may include: a magnetic hard disk; a floppy disk; an optical disk, such as a CD-ROM and a DVD; a magnetic tape; a memory chip; and/or other types of media that can store machine-readable instructions thereon.

A "computer system" may refer to a system having one or more computers, where each computer may include a computer-readable medium embodying software to operate the computer. Examples of a computer system may include: a distributed computer system for processing information via computer systems linked by a network; two or more computer systems connected together via a network for transmitting and/or receiving information between the computer systems; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those that may be made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an interne, such as the Internet; an intranet; a local area network (LAN); a wide area network (WAN); and a combination of networks, such as an interne and an intranet. Exemplary networks may operate with any of a number of protocols, such as Internet protocol (IP), asynchronous transfer mode (ATM), and/or synchronous optical network (SONET), user datagram protocol (UDP), IEEE 802.x, etc.

DETAILED DESCRIPTION OF EMBODIMENTS

Exemplary embodiments are discussed in detail below. While specific exemplary embodiments are discussed, it should be understood that this is done for illustration purposes only. In describing and illustrating the exemplary embodiments, specific terminology is employed for the sake of clarity. However, the invention is not intended to be limited to the specific terminology so selected. A person skilled in the relevant art will recognize that other components and configurations may be used without parting from the spirit and scope of the invention. It is to be understood that each specific element includes all technical equivalents that operate in a similar manner to accomplish a similar purpose. The examples and embodiments described herein are non-limiting examples.

Figure 2:
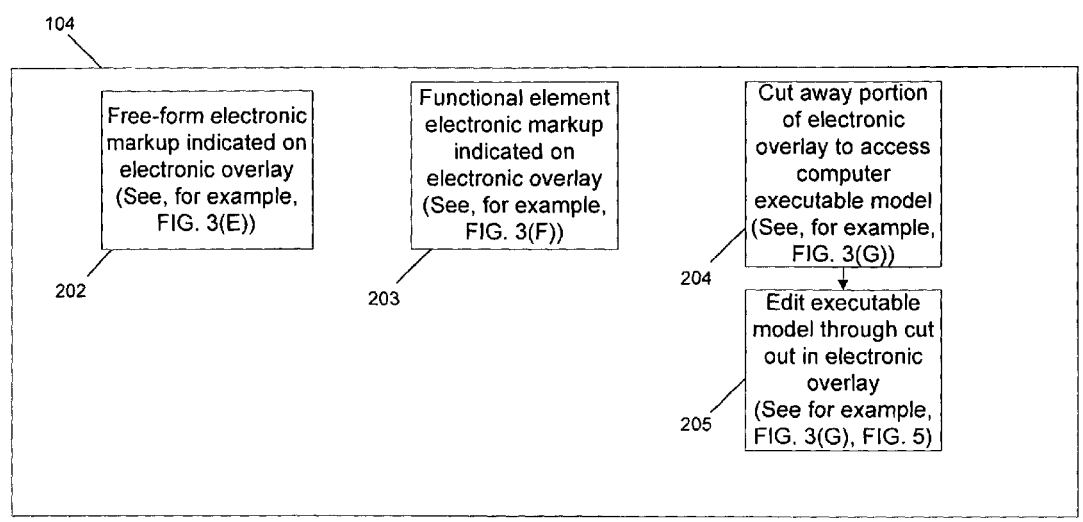
FIG. 2 depicts an exemplary flowchart for performing operations on electronic overlays in an exemplary electronic markup system.

FIGS. 1 and 2 depict exemplary flowcharts for an exemplary electronic markup system. FIGS. 3(A)-3(H) depict exemplary embodiments of a graphical executable model, an exemplary electronic overlay associated with a graphical executable model, an exemplary embodiment of electronic markup indicated on an exemplary electronic overlay, and an exemplary window associated with an exemplary electronic overlay, in accordance with the steps of FIG. 1 and FIG. 2. Additional information is provided in FIG. 1 and FIG. 2 to assist the reader in understanding the exemplary embodiments.

In block 101, a user may initiate an executable modeling environment. The executable modeling environment may be a graphical executable modeling environment or a non-graphical executable modeling environment.

Figure 3A:
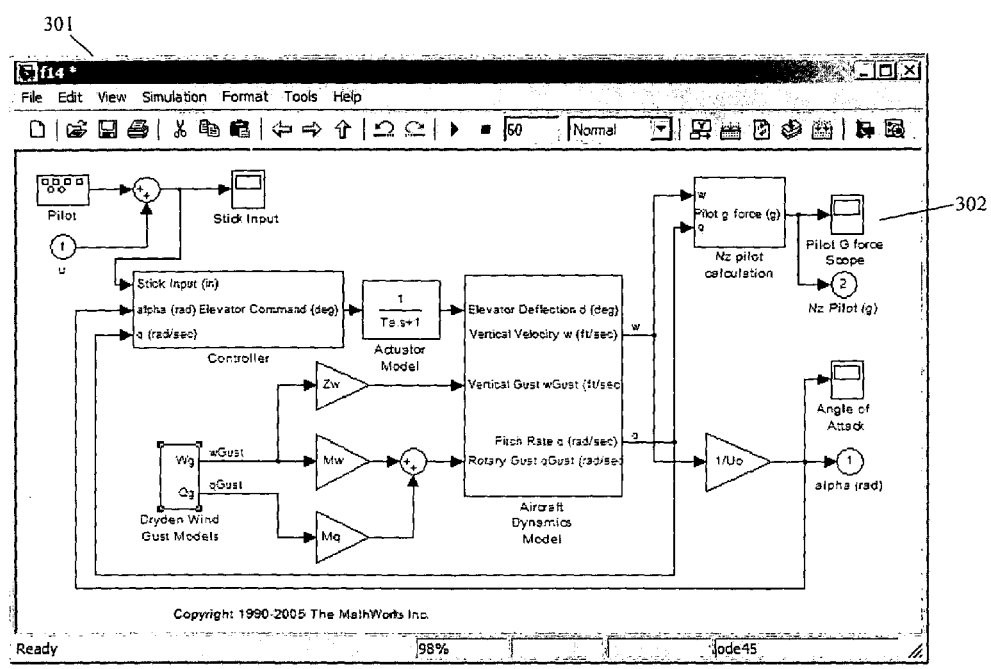
FIG. 3(A) depicts an exemplary embodiment of a graphical executable model.

The graphical executable modeling environment may be an environment in which a graphical model or parts of a graphical model may be executed. Examples of a graphical executable modeling environment may include: Simulink® by The MathWorks, Inc.; Stateflow® by The MathWorks; SimEvents™ by The MathWorks; SimMechanics by The MathWorks; LabView® by National Instruments, Inc.; VisSim by Visual Solutions, Inc.; Dymola by Dynasim; SoftWIRE by Measurement Computing; WiT by DALSA Coreco; VEE Pro or SystemVue by Agilent; Gedae by Gedae, Inc.; Scicos from The French National Institute for Research in Computer Science and Control (INRIA); aspects of a Unified Modeling Language (UML) or SysML environment; among others. For example, as depicted in FIG. 3(A), the executable modeling environment 301 may be an executable modeling environment for a graphical executable model 302.

Figure 4:
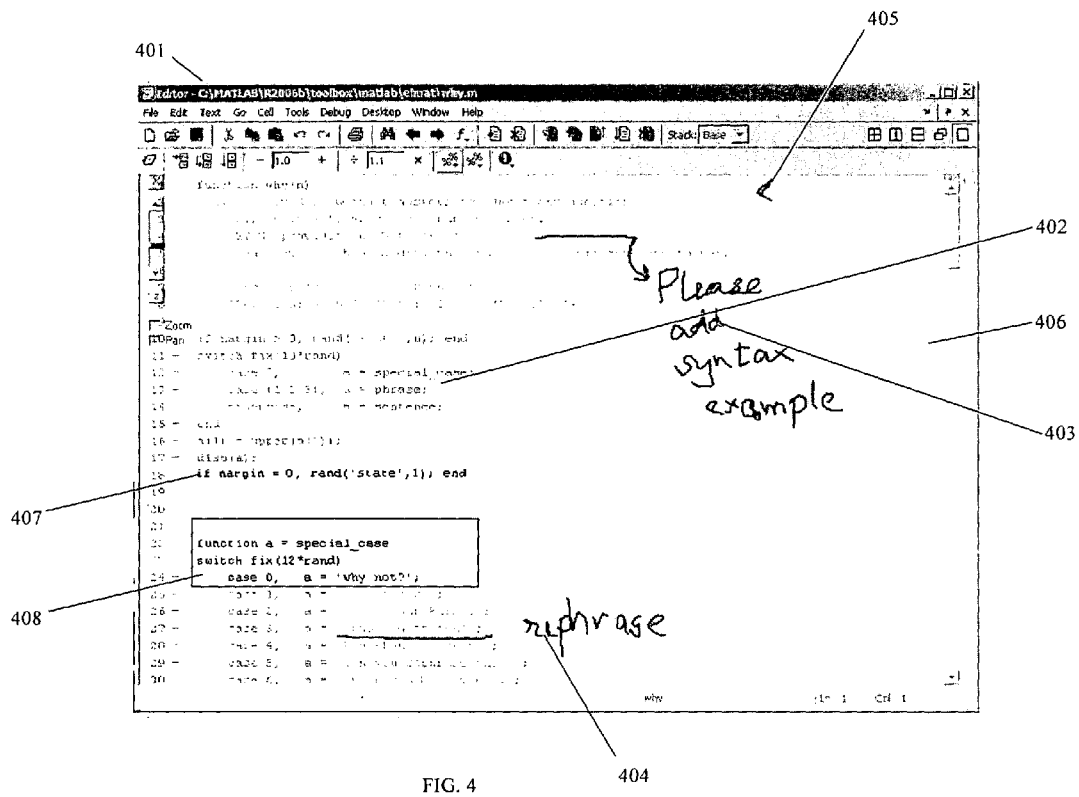
FIG. 4 depicts an exemplary embodiment of an electronic overlay placed over an exemplary non-graphical executable model, where exemplary free-form electronic markup and exemplary functional element electronic markup has been indicated on the electronic overlay.

The non-graphical executable modeling environment may be an executable modeling environment for a non-graphical executable model. Examples of a non-graphical executable modeling environment may include: MATLAB® by The MathWorks; MATHEMATICA® by Wolfram Research; Comsol Script® by Comsol, Inc.; Scilab from INRIA; a C++ Integrated Development Environment; a Java development environment; elements of an integrated development environment such as a textual editor, for example GNU Emacs. For example, as depicted in FIG. 4, the executable modeling environment 401 may be an executable modeling environment for a non-graphical executable model 402.

It is possible for the executable modeling environment to have aspects that are both graphical and non-graphical. Moreover, the executable modeling environment may include and/or may be implemented using languages, such as programming languages, technical computing languages, etc. The executable modeling environment may be run within a computer operating system, for example, a MacOS, Windows XP, or Unix based operating system. The executable modeling environment may contain program windows in which various aspects of the executable model are displayed. The executable modeling environment may include a hierarchy for the executable model. For example, Simulink® by the MathWorks includes a Simulink® model hierarchy for executable models within Simulink®. The layers of this hierarchy may be implemented by, for example, subsystems that, when opened, show details of how the behavior at the higher level is implemented. A hierarchy for an executable model may allow for the opening of program windows, the windows displaying various aspects of the executable model, or for the aspects of the executable model to be displayed within the same program window. Program windows displaying various aspects of the executable model may be opened and closed in various manners, for example, by pointing device events such as a mouse double-click event, from a command line, from a popup menu, or from callbacks within the executable model. Program windows displaying various aspects of an executable model may be docked within a multi-document interface. An executable modeling environment may contain a model explorer, for example, Model Explorer of Simulink®. A model explorer may display explicitly a hierarchal representation of an executable model and selected elements of the executable model.

In block 102, an executable model may be generated through the executable modeling environment or a previously generated executable model may be loaded into the executable modeling environment. The executable model may be displayed to a user via a display, for example a computer monitor. The executable model may be displayed within a program window. The executable model may be a graphical executable model, for example, a graphical model, or a non-graphical executable model, for example, a non-graphical model. An example of a non-graphical executable model may be a text written executable model such as a text-based model written in a technical computing language such as MATLAB®, or in a programming language such as C++. Alternatively, the executable model may be a graphical executable model, such as a model created with Simulink®, or model created with Stateflow® by the MathWorks. In one implementation, a graphical executable model may use text based code. FIG. 3(A) depicts a graphical executable model 302 that has been loaded into an executable modeling environment 301. The graphical executable model 302 may be, for example, a block element based graphical executable model.

In block 103, an electronic overlay may be associated with the executable model. The electronic overlay may be suitable for various kinds of electronic markup. Electronic markup may refer to any edit or notation made electronically. Electronic markup may be, for example, free-form electronic markup, including typewritten and hand written notes and hand drawn symbols indicated on the electronic overlay, as, discussed below in block 202. Electronic markup may be, for example, functional element electronic markup, including functional elements used to create the executable model in the executable modeling environment, as discussed below in block 203. The electronic overlay may be two-dimensionally aware, such that it can take into account the positioning of electronic markup on the electronic overlay relative to the executable model or another electronic overlay. Additionally, the two-dimensionally aware electronic overlay may take into account zoom levels and/or orientations of the executable model. The electronic overlay may be electronically associated with the graphical executable model that has been created in or loaded into the executable modeling environment. The electronic overlay may be displayed with the executable model within the executable modeling environment. The electronic overlay may be displayed in a program window displaying all or an aspect of the executable model to which the electronic overlay is associated. The electronic markup may be used with conventional electronic markup techniques.

Figure 3B:
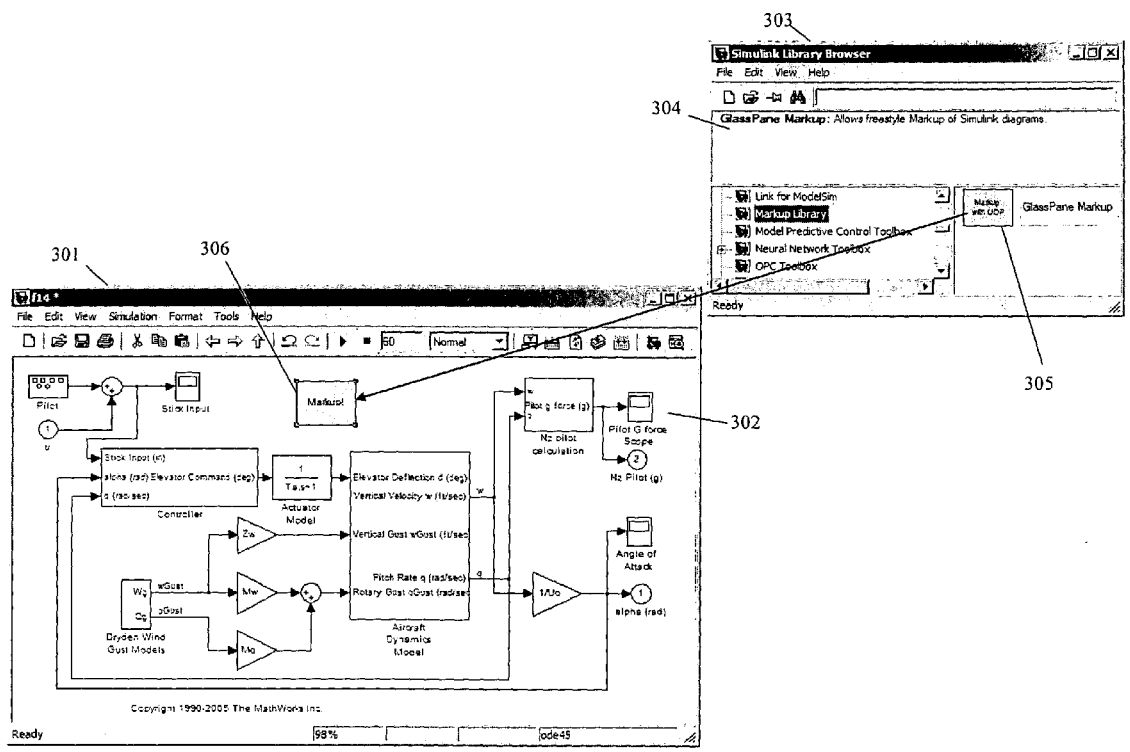
FIG. 3(B) depicts an exemplary embodiment of a graphical executable model electronic overlay block allowing a user to initiate the addition of an electronic overlay.

FIG. 3(B) depicts an exemplary embodiment of the association of an electronic overlay to the executable model 302. The electronic overlay may be placed over the graphical executable model 302 through the use of an electronic markup block 305 available from a library 303. An electronic markup block may refer to a portion of the display or the executable model in which one or more electronic overlays of the executable model may be accessed. In a graphical executable modeling environment, the electronic markup block may be a functional element of the type used in the graphical executable modeling environment, which may be selected in order to initiate the manipulation of an electronic overlay or electronic overlays that have been associated with the executable model. In a non-graphical executable modeling environment, the electronic markup block may be a line of text that has been commented out. The electronic markup block 305 may have its properties displayed in a property display section 304 of the library 303. The electronic markup block 305 may be added to the graphical executable model 302 and appear as a functional electronic markup block 306. The functional electronic markup block 306 may be selected in the graphical executable model 302 to initiate manipulation of an electronic overlay.

Figure 3C:
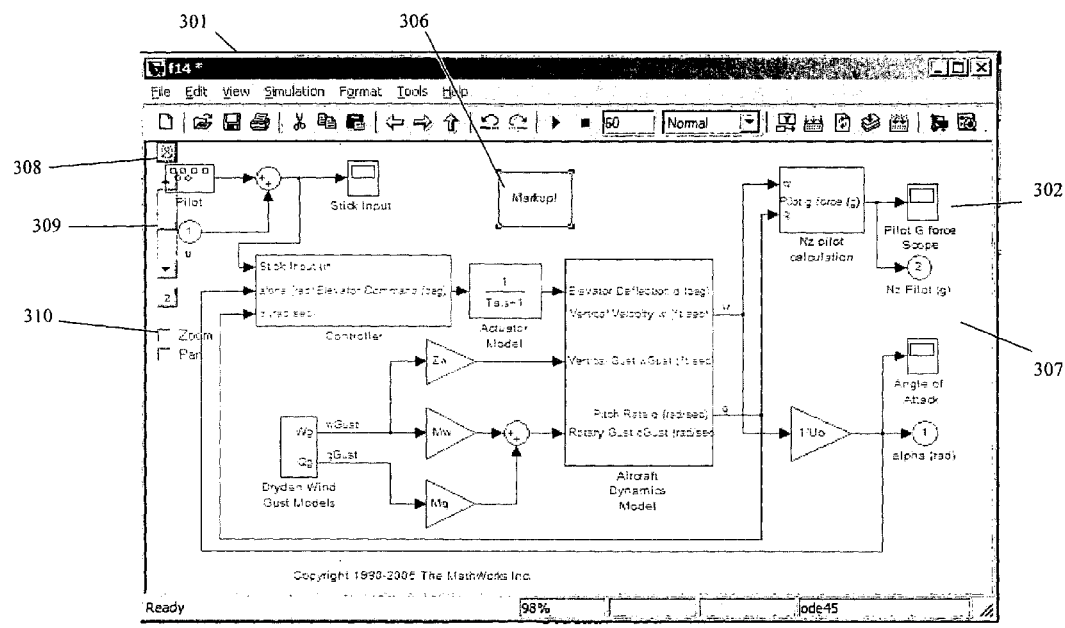
FIG. 3(C) depicts an exemplary embodiment of an electronic overlay placed over an exemplary embodiment of a graphical executable model.
Figure 3D:
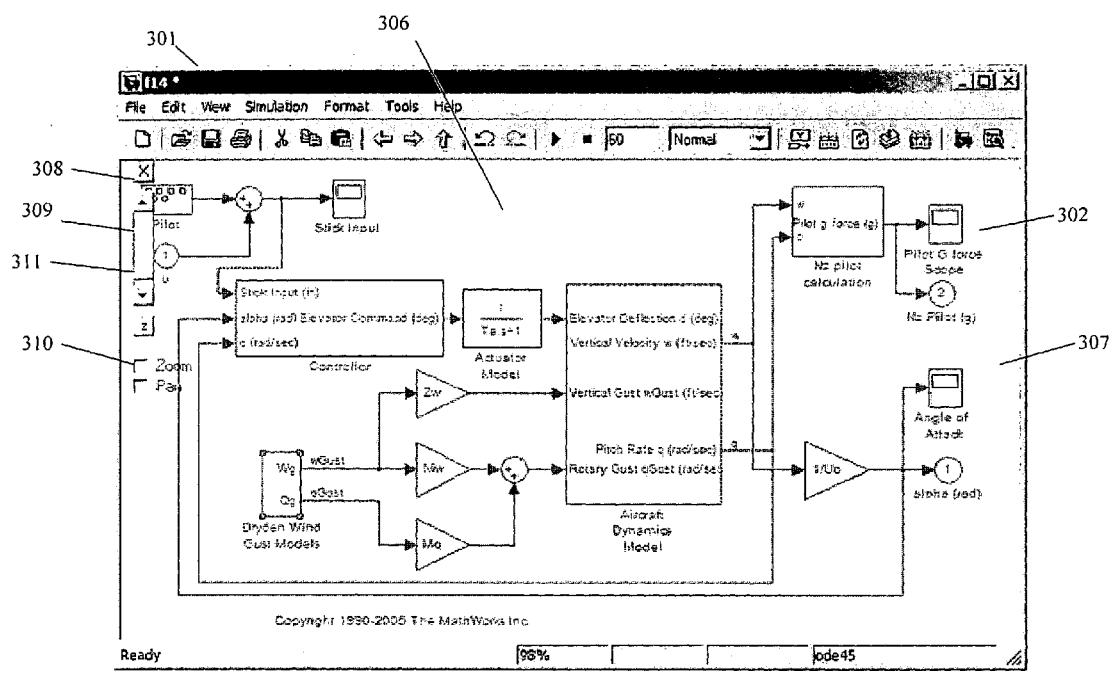
FIG. 3(D) depicts an exemplary embodiment of an electronic overlay placed over an exemplary graphical executable model, where the electronic overlay has been made partially opaque.

In FIG. 3(C), the exemplary electronic overlay 307 has been associated with the exemplary graphical executable model 302. The electronic overlay 307 may have a plurality of controls to allow manipulation of various properties of the electronic overlay. For example, the electronic overlay 307 may have a switch 308 that may allow the electronic overlay 307 to be switched between an on-state and off-state, causing the electronic overlay 307 to disappear when not needed and reappear when needed. For example, in FIG. 3(C) the electronic overlay 307 may have a slider 309 that allows for user-controllable or automatically configurable opaqueness. Further, the electronic overlay can be made more or less transparent by adjusting the slider 309. In FIG. 3(D), a slider position 311 of the slider 309 may be adjusted so that the electronic overlay 307 becomes less transparent. In lieu of or in addition to the slider 309, other suitable control mechanisms may be used to allow for the electronic overlay to be made more or less transparent. The electronic overlay 307 may have a plurality of additional appearance controls 310, such as, for example, controls that allow zooming into or out from the electronic overlay 307, controls for adjusting the appearance of electronic markup, controls for locking the contents of the electronic overlay 307, controls for merging the contents of two or more electronic overlays, controls for creating another electronic overlay from subsets of the contents of the electronic overlay 307, controls for associating a window with the electronic overlay 307 as described below, controls for naming, renaming, saving, exporting or importing the electronic overlay 307, controls for setting a security level for the electronic overlay 307, or controls for adjusting the position of the electronic overlay 307 relative to other electronic overlays that have been associated with the same executable model 302.

In block 104, once the electronic overlay has been placed over the executable model, a variety of operations may be performed on the electronic overlay. Such operations may include indicating free-form electronic markup on the electronic overlay, indicating functional elements electronic markup on the electronic overlay, associating a window with the electronic overlay, and editing the executable model through the window. Input from an input device of the computer may be used to provide the electronic markup on the electronic overlay, associate a window with the electronic overlay, and edit the executable model through the window. Examples of an input device may include a computer keyboard, a mouse, a touch-pad, a touch-screen, an accelerometer or gyroscope based device, a stylus, a biometric input device, etc.

Free-form electronic markup may refer to electronic markup that does not take the form of the functional elements used in the executable modeling environment. Examples of free-form electronic markup may include: handwritten notes, hand drawn lines, hand drawn symbols and typed text characters.

Functional element electronic markup may refer to edits or modifications (e.g., adding, deleting, or changing) of functional elements used by the executable modeling environment. The graphical executable modeling environment may contain block elements which represent various types of instrumentation or perform validation or signal transformation functions. For example, a graphical executable modeling environment may contain a block element to represent the clutch control system of a car in a graphical executable model. The various block elements may be the functional elements of a graphical executable model. Functional element electronic markup may be the indication of functional elements on the electronic overlay. Functional element electronic markup may be indicated on the electronic overlay that has free-form electronic markup indicated on the electronic overlay. Block 104 is further discussed below in FIG. 2.

In an exemplary embodiment, operations may be performed on the electronic overlay associated with the executable model within a networked computing environment, for example, the Internet. Multiple users may have simultaneous access to the electronic overlay, and electronic markup indicated on the electronic overlay by a user may be displayed to the other users via a monitor, using, for example, a web-based interface such as Scalable Vector Graphics, AJAX, or FLASH. Electronic markup may be received from users over a remote access connection. Additionally, communication between the multiple users may occur through a communications device, for example, a phone, or an internet-based chat service, to allow, for example, a user to explain an electronic markup being made on the electronic overlay to other users.

FIG. 2 depicts an exemplary embodiment of a flowchart for block 104 in FIG. 1. In block 104, a plurality of operations may be performed on the electronic overlay that has been associated with the executable model.

Figure 3E:
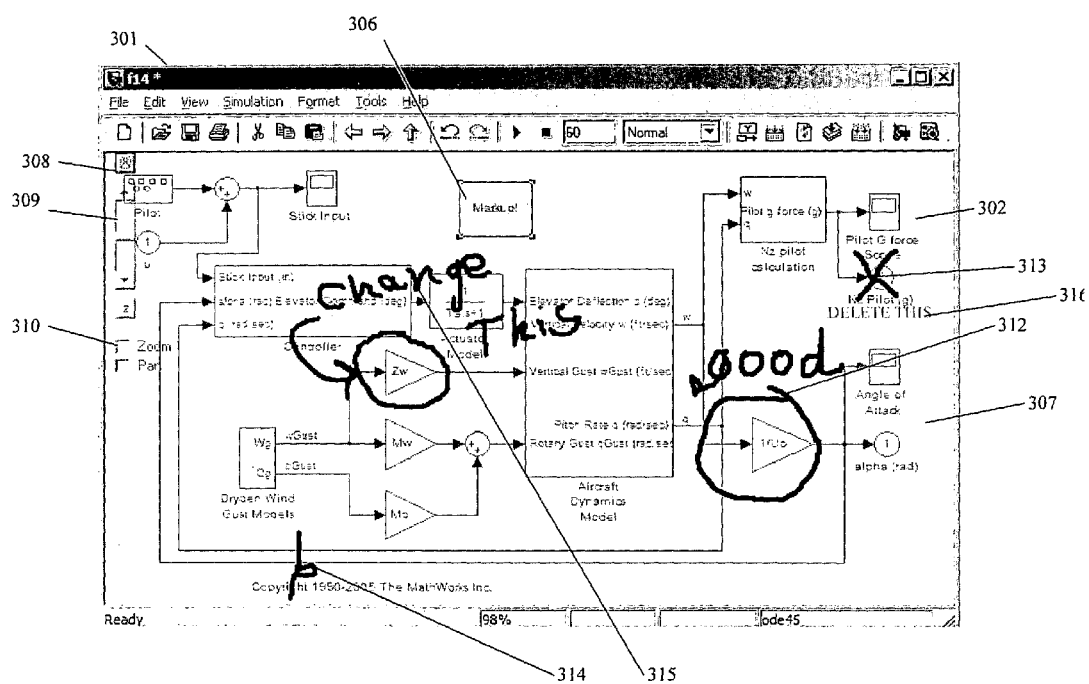
FIG. 3(E) depicts an exemplary embodiment of an electronic overlay placed over an exemplary graphical executable model where exemplary free-form electronic markup has been indicated on the electronic overlay.

In block 202, free-form electronic markup may be indicated on the electronic overlay. FIG. 3(E) depicts exemplary free-form electronic markup 312, 313, 314, and 315 indicated on the exemplary electronic overlay 307. Free-form electronic markup may be indicated on the electronic overlay in any of a plurality of colors, line widths, font styles and other aspects which affect the visual appearance of electronic markup. Different free-form electronic markups on the same electronic overlay may have different colors, different line widths, different font styles, and may vary in any other aspect that affects the visual appearance of an electronic markup. The visual appearance of each mark up may be edited. For example, free-form electronic markup may be handwritten notes, hand drawn symbols or it may be some combination thereof 312. Free-form electronic markup may be, for example, typewritten notes. In FIG. 3(E) the free-form electronic markup includes handwritten notes 315, hand drawn symbols 313 and 314, a combination 312 of handwritten notes and hand drawn symbols, and typewritten notes 316. The electronic markup may be indicated on the electronic overlay by, for example, adding, deleting, or changing the electronic markup. Electronic markups may be accompanied by other types of user notification mechanisms, such as audible indicators, tactile indicators, etc.

In an exemplary embodiment, free-form electronic markup may be interpreted by the executable modeling environment to be functional electronic markup. For example, a hand drawn symbol 313 may be interpreted by the executable modeling environment as a command to exclude the functional element of the executable model over which it is marked when the executable model is executed. In an exemplary embodiment, functional electronic markup may be merged with the executable model. For example, after the free-form electronic markup is interpreted as functional electronic markup, the user may make a selection to merge functional electronic markup with the executable model. For example, a selection to merge the hand drawn symbol 313 with the executable model 302 may result in the deletion of the functional element of the executable model over which the symbol 313 is drawn as well as the deletion of the symbol 313.

In an exemplary embodiment, free-form electronic markup may be anchored to an element of the executable model or to another electronic markup. When a free-form electronic markup is anchored to an element of the executable model or another electronic markup, editing the executable model or electronic markup in a way that causes the element or electronic markup to move may result in the anchored electronic markup moving with element or electronic markup in order to maintain the same position relative to the element or electronic markup to which the free-form electronic markup is anchored.

Figure 3F:
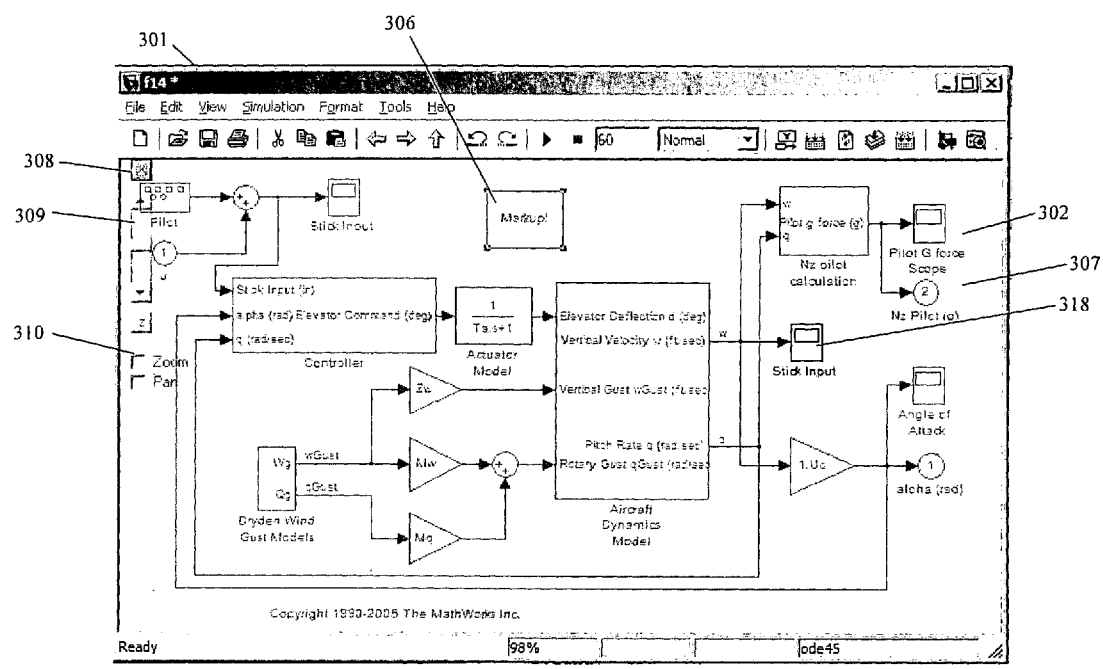
FIG. 3(F) depicts an exemplary embodiment of an electronic overlay placed over an exemplary graphical executable model where exemplary functional element electronic markup has been indicated on the electronic overlay.

In block 203, functional element electronic markup may be indicated on the electronic overlay. FIG. 3(F) depicts exemplary functional element electronic markup 318 indicated on the electronic overlay. Functional elements may be indicated on the electronic overlay instead of being placed in the executable model. When the electronic overlay on which a functional element electronic markup is indicated is in an on-state the functional elements may be treated as if they are part of the executable model when the executable model is executed. The executable model may be executed as if a functional element indicated on the electronic overlay has been integrated into the executable model without the need to edit the executable model itself. Functional element electronic markup indicated on an electronic overlay does not change the content of the executable model to which the electronic overlay is associated. As an option, a selection may be made to merge a functional element electronic markup indicated on an electronic overlay into the executable model, changing the content of the executable model. Functional element electronic markup may be indicated on the electronic overlay by, for example, adding, deleting, or changing the electronic markup.

Figure 3G:
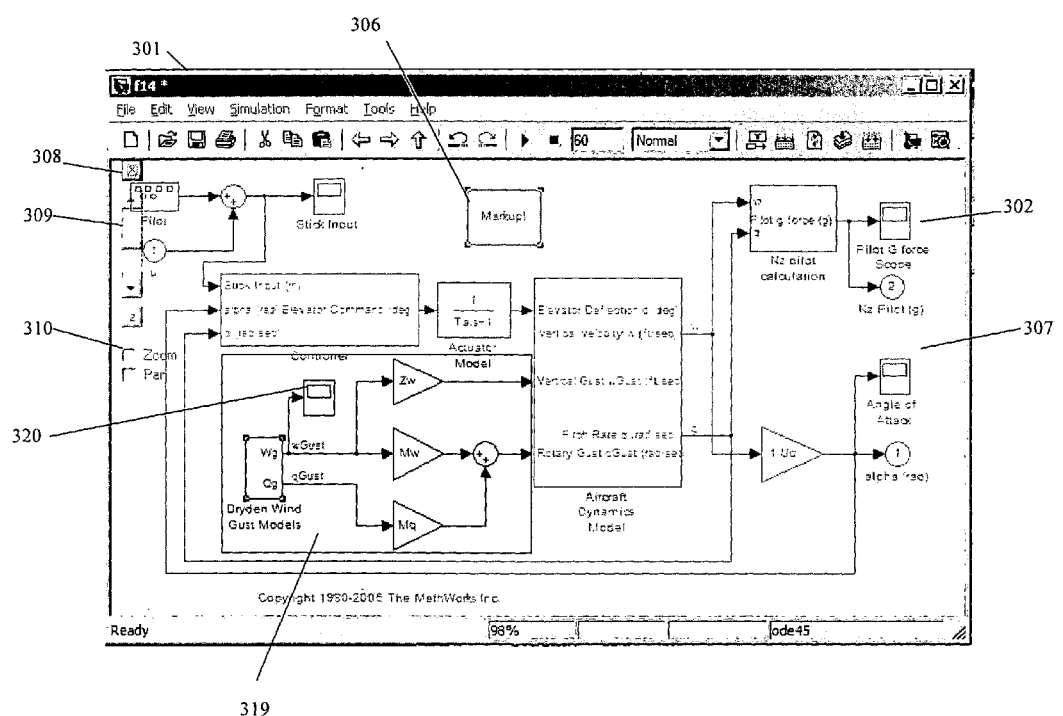
FIG. 3(G) depicts an exemplary embodiment of an electronic overlay placed over an exemplary graphical executable model, where an exemplary window has been associated with the electronic overlay.

In block 205, a window may be associated with the electronic overlay to allow for direct access to the executable model. The window associated with the electronic overlay may be a section of the electronic overlay that is cut away, permitting direct access to all or a portion of the executable model. For example as depicted in FIG. 3(G), a window 319 may be associated with the electronic overlay 307. In this way a portion of an executable model may be accessed directly without having to either set the electronic overlay to an off-state or use an alternative method of directing input, while the balance of the executable model not within the area covered by the window may remain inaccessible directly unless an alternative method of directing input is used. An alternative method of directing input may be, for example, directing input that occurs in an area of an electronic overlay without a window to the executable model when there are no functional electronic markups in the area of the electronic overlay. The window may have a separate opaqueness setting from the opaqueness setting of the rest of an electronic overlay.

In block 206, the executable model may be edited directly through the window associated with the electronic overlay. The window associated with the electronic overlay may allow for direct editing of the executable model. When the electronic overlay is in an on-state, input from any the input devices may be directed to the electronic overlay. For example, when the electronic overlay is in an on-state, holding down a mouse button and moving the mouse may draw a line on the electronic overlay. In order to send input such as input from a mouse to the executable model, the electronic overlay may be switched to an off-state. To edit the executable model by sending input to the executable model while the electronic overlay is still in an on-state, a window may be associated with the electronic overlay. Input from any of the input devices may be sent to the executable model when that input occurs in the area defined by the window associated with the electronic overlay. Input may be sent to the electronic overlay when that input occurs in all other non-window areas of the electronic overlay. In this way it may be possible to directly edit the executable model while the electronic overlay is in an on-state. For example, as depicted in FIG. 3(G), the element 320 is added to the executable model 302 via the window 319. As an alternative, input from the input device may be sent to the executable model if the input device is configured to send input to the executable model even when an electronic overlay associated with the executable model is in an on-state. For example, the executable modeling environment may be configured to send input to the executable model when input from the mouse occurs in an area of the electronic overlay in which there are no electronic markups.

Referring back to FIG. 1, in block 105, a number of operations may be performed involving the management of the electronic overlay. These operations are further discussed below in block 106, block 107, block 108 and block 109.

In block 106, the executable model may be executed. The executable model may be executed with or without the functional elements from the electronic overlay. If the executable model is executed without the functional elements from the electronic overlay, the executable model is executed as if no modifications were made to the program. If the executable model is executed with the functional elements from the electronic overlay, the executable model may be executed as if the functional elements were actually inserted into the executable model based on the place where they are positioned on the electronic overlay relative to the executable model, although the executable model itself is not changed.

Figure 5:
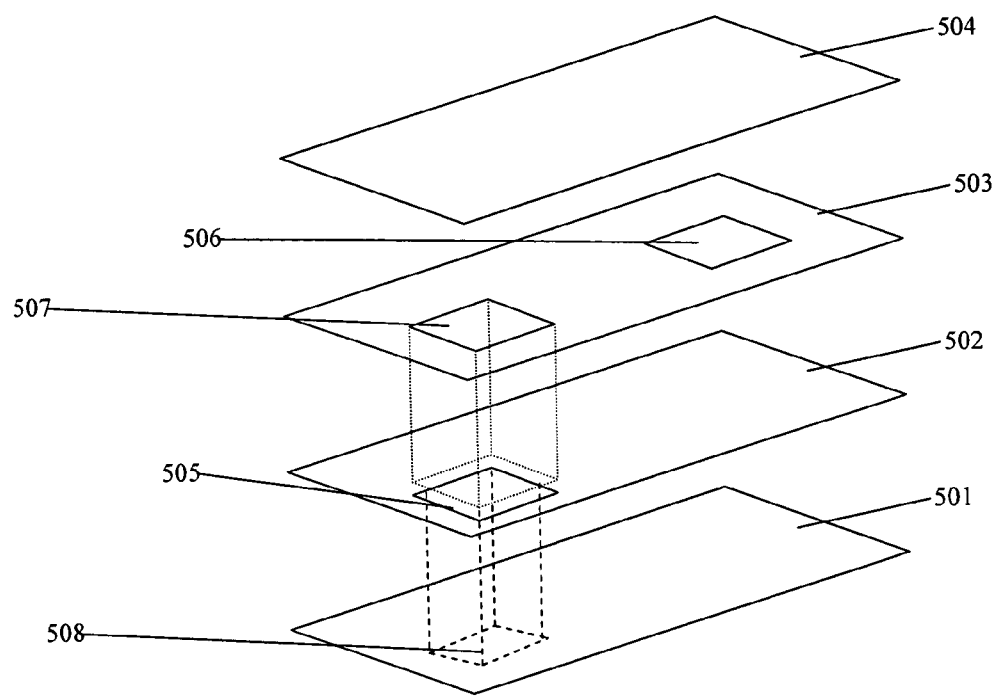
FIG. 5 depicts an exemplary executable model with more than one associated electronic overlay.

In block 107, an additional electronic overlay may be associated with the executable model. If the additional electronic overlay is associated, a variety of operations may be performed to the additional electronic overlay as in block 104. A single executable model may have more than a single electronic overlay associated with it. An example of multiple electronic overlays is depicted in FIG. 5. After initiating an executable modeling environment and loading or creating an executable model 501, a first electronic overlay 502 may be associated. A second electronic overlay 503 may be associated on top of the first electronic overlay 502, and a third electronic overlay 504 may be associated on top of the second electronic overlay 503, and so on. In addition, an electronic overlay may be associated in between existing electronic overlays. Further, the order of the electronic overlays may be switched. Each electronic overlay may be switched to an on- or off-state. Each electronic overlay may be locked to prevent changes to the electronic overlay, or unlocked to allow changes to the electronic overlay. Each electronic overlay may have different settings pertaining to different users of the executable modeling environment. For example, a user may be allowed to edit only one specific electronic overlay associated with a computer, while another user may be allowed to edit all of the electronic overlays associated with an executable model. The edits a user is allowed to make to the electronic overlay may be referred to as user privileges. A version control system may be used to keep track of the executable model and the changes to the electronic overlays associated with the executable model. The executable model may be executed with the integration of functional elements from one or more electronic overlays. A window may be associated with an electronic overlay independent of windows associated with any other electronic overlay for the same executable model. As illustrated in FIG. 5, the first electronic overlay 502 has a window 505 associated with it, and the second electronic overlay 503 has a separate window 506 associated with it.

In block 108, the electronic overlay may be saved. The electronic overlay may be saved as part of the same file as the executable model to which it has been associated, or as a separate file from the file in which the executable model is saved. The electronic overlay may exist as part of the file used to store the executable model, and be saved as part of the file used to store the executable model, or it may also exist as a separate file linked to the file used to store the executable model, and be saved as separate file from the file used to store the executable model.

In block 109, one of the previously associated electronic overlays may be selected, allowing for further operations to be performed on the selected electronic overlay as in block 104. Additionally, two or more electronic overlays may be selected at the same time, and the two or more electronic overlays may have their properties adjusted at the same time. For example, two electronic overlays may be selected at the same time and have their opaqueness adjusted together.

In block 110, if no more operations involving the management of electronic overlays are performed, flow ends.

FIG. 4 depicts an electronic overlay 406 associated with a non-graphical executable model 402 with free-form and functional element electronic markup indicated on it. A non-graphical executable model may be displayed in an executable modeling environment 401. Here the executable modeling environment 401 is MATLAB®. The above described operations, as exemplified in the flowcharts of FIG. 1 and FIG. 2, may be performed on the non-graphical executable model 402. For example, free-form electronic markup 403, 404 and 405 and functional element electronic markup 407 as described above may be indicated on the electronic overlay 406 for the non-graphical executable model 402. A window 408 may be associated with the electronic overlay 406. A non-graphical executable model may be executed with the integration functional element markup indicated on the electronic overlay associated with the non-graphical executable model, without changing the executable model. For example, executable model 402 may be executed with functional element markup 407 from electronic overlay 406, causing executable model 402 to run as if it included functional element markup 407. As an option, functional element markup indicated on an electronic overlay may be merged into a non-graphical executable model. In one implementation, any other operation which may be performed with an electronic overlay and a graphical executable model may be performed with the electronic overlay 406 and the non-graphical executable model 402.

FIG. 5 depicts an exemplary embodiment of an executable model 501 with three associated electronic overlays 502, 503 and 504. As discussed above in block 107, the executable model 501 that has the first electronic overlay 502 may also have additional electronic overlays associated, such, as for instance, the second electronic overlay 503 and the third electronic overlay 504. Each individual electronic overlay 502, 503 and 504 may be manipulated in the same manner as a single electronic overlay 502, as discussed above. The order of the electronic overlays 502, 503 and 504 may be rearranged, for example, the first electronic overlay 502 may be moved after the third electronic overlay 504. Each individual electronic overlay 502, 503, and 504 may have one or more windows associated with it, such as the window 506 on the first electronic overlay 502 and the window 505 on the second electronic overlay 503. When the first electronic overlay 502 and the second electronic overlay 503 are in an on-state, the executable model 501 may not be accessed through the window 505 on the first electronic overlay 502 because electronic overlay 503 blocks the window 505. If the second electronic overlay 503 has the window 507 indicated associated with it, and the position of this window 507 overlaps the position of the window 506 associated with the first electronic overlay 502, then the executable model 501 may be accessed directly through this overlapping area 508.

Figure 6:
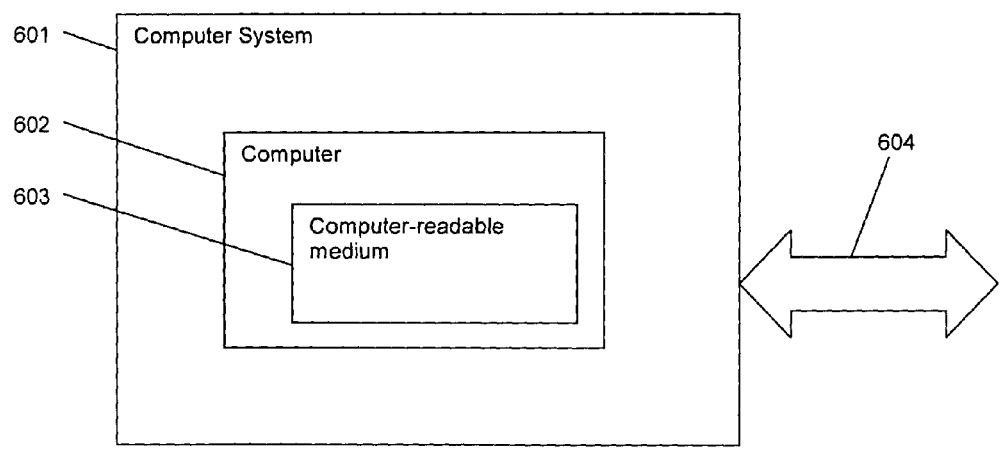
FIG. 6 depicts a computer system for an exemplary embodiment of the invention.

FIG. 6 depicts a computer system for use with embodiments of the present invention. The computer system 601 includes a computer 602 for implementing the invention. The computer 602 includes a computer-readable medium 603 embodying software for implementing the invention and/or software to operate the computer 602 in accordance with the invention. As an option, the computer system 601 includes a connection to a network 604. With this option, the computer 602 is able to send and receive information (e.g., software, data, documents, etc.) from other computer systems via the network 604.

Figure 7:
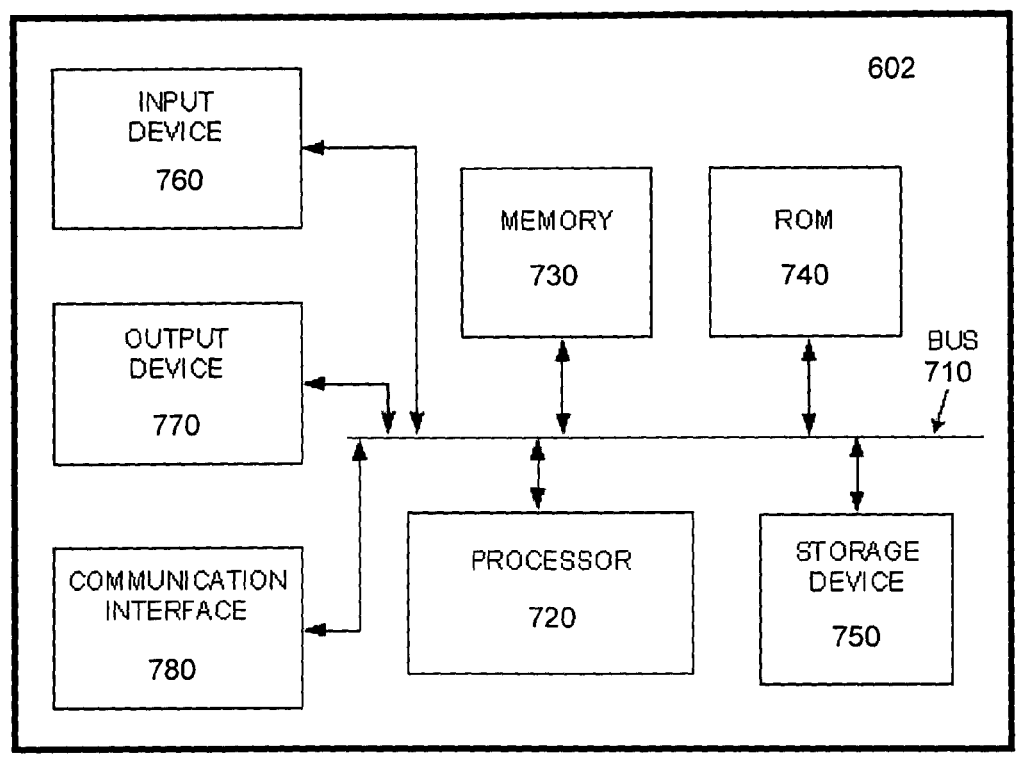
FIG. 7 depicts an exemplary architecture for implementing computer 630 of FIG. 6.

FIG. 7 depicts an exemplary architecture for implementing computer 630 of FIG. 6. As illustrated in FIG. 7, computer 602 may include a bus 710, a processor 720, a memory 730, a read only memory (ROM) 240, a storage device 750, an input device 760, an output device 770, and a communication interface 780.

Bus 710 may include one or more interconnects that permit communication among the components of computer 602. Processor 720 may include any type of processor, microprocessor, or processing logic that may interpret and execute instructions (e.g., a field programmable gate array (FPGA)). Processor 720 may include a single device (e.g., a single core) and/or a group of devices (e.g., multi-core). Memory 730 may include a random access memory (RAM) or another type of dynamic storage device that may store information and instructions for execution by processor 720. Memory 730 may also be used to store temporary variables or other intermediate information during execution of instructions by processor 720.

ROM 740 may include a ROM device and/or another type of static storage device that may store static information and instructions for processor 720. Storage device 750 may include a magnetic disk and/or optical disk and its corresponding drive for storing information and/or instructions. Storage device 750 may include a single storage device or multiple storage devices, such as multiple storage devices operating in parallel. Moreover, storage device 750 may reside locally on computer 602 and/or may be remote with respect to computer 602 and connected thereto via network 604 and/or another type of connection, such as a dedicated link or channel.

Input device 760 may include any mechanism or combination of mechanisms that permit an operator to input information to computer 602, such as a keyboard, a mouse, a touch sensitive display device, a microphone, a pen-based pointing device, a camera, a video camera, motion-based input devices, neuro-machine interface devices and/or a biometric input device, such as a voice recognition device and/or a finger print scanning device. Output device 770 may include any mechanism or combination of mechanisms that outputs information to the operator, including a display, a printer, a speaker, etc.

Communication interface 780 may include any transceiver-like mechanism that enables computer 602 to communicate with other devices and/or systems. For example, communication interface 780 may include one or more interfaces, such as a first interface coupled to network 604. Alternatively, communication interface 780 may include other mechanisms (e.g., a wireless interface) for communicating via a network, such as a wireless network. In one implementation, communication interface 780 may include logic to send code to a destination device, such as a target device that can include general purpose hardware (e.g., a personal computer form factor), dedicated hardware (e.g., a digital signal processing (DSP) device adapted to execute a compiled version of a model or a part of a model), etc.

Computer 602 may perform certain functions in response to processor 720 executing software instructions contained in a computer-readable medium, such as memory 730. In alternative embodiments, hardwired circuitry may be used in place of or in combination with software instructions to implement features consistent with principles of the invention. Thus, implementations consistent with principles of the invention are not limited to any specific combination of hardware circuitry and software.

Exemplary embodiments of the invention may be embodied in many different ways as a software component. For example, it may be a stand-alone software package, or it may be a software package incorporated as a "tool" in a larger software product, such as, for example, a mathematical analysis product or a statistical analysis product. It may be downloadable from a network, for example, a website, as a stand-alone product or as an add-in package for installation in an existing software application. It may also be available as a client-server software application, or as a web-enabled software application.

The examples and embodiments described herein are non-limiting examples and many alternative embodiments are possible in view of the teachings herein. For example, a first alternative embodiment may include an entity relationship diagram, such as a block diagram, a flow chart, an organizational chart, etc. An entity relationship diagram may include electronic diagrams that include representations (e.g., blocks, icons, symbols, etc.) that can have relationships therebetween. For example, a block diagram may include a first block that is linked to a second block using a line, where the line may indicate a direction for information flow. The block diagram may represent the blocks (entities) in a manner that indicates the relationship between the blocks (e.g., one block being a parent or a superior block with respect to another block). Entity relationship diagrams may include representations that are non-executable (i.e., that do not include executable code) and/or that are executable.

In the first alternative embodiment, one or more overlays (e.g., electronic markup layers) can be used with the entity relationship diagram to associate additional information with the diagram (e.g., annotations, instructions, additional entities, additional relationships, etc.). For example, a first manager may add annotations to the entity relationship diagram using a first electronic markup overlay and a second manager may add a series of instructions and/or additional entities to a second electronic markup overlay that can be associated with the diagram. The first and second electronic overlays may be arranged in substantially any order and/or can be used with substantially any number of additional overlays.

A second alternative embodiment may include one or more electronic markup overlays that are used with a graphical or non-graphical executable model, where the one or more of the overlays affects functionality of the executable model. For example, a first overlay may include handwritten blocks and lines (e.g., signal lines) that connect the handwritten blocks to blocks in the model. A second overlay may include handwritten changes that are related to both the first overlay and information, such as blocks, in the model. The first overlay and/or the second overlay may be executable alone or in combination with the model and may alter functionality of the model. For example, a user may receive the first and second overlay from a first and second reviewer. The user may run the model with the overlays to determine how proposed edits/changes made by the reviewers will impact the model. The user may accept or reject changes related to the first or second overlays alone or in combination. In addition, the user may be able to add his/her own handwritten edits to one or more of the overlays to further affect the functionality of the model.

While various exemplary embodiments have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A computer-implemented method for marking-up an executable model in an executable modeling environment, comprising:
    displaying the executable model to a user, wherein the executable model contains at least one executable element;
    associating an electronic overlay with the executable model, the electronic overlay operating with the executable model without changing the executable model;
    receiving an electronic markup in the electronic overlay, wherein the electronic markup affects the functionality of the at least one executable element contained in the executable model when the electronic markup is executed with the executable model;
    displaying the electronic markup in the electronic overlay; and
    executing, using a processing device, the executable model with the electronic overlay, wherein the electronic markup in the electronic overlay affects the functionality of the at least one executable element contained in the executable model during execution of the executable model.

2. A computer-implemented method as in claim 1, wherein the electronic markup is free-form electronic markup.

3. A computer-implemented method as in claim 1, wherein the electronic markup is functional element electronic markup.

4. A computer-implemented method as in claim 1, further comprising:
    associating a second electronic overlay with the executable model, the second electronic overlay operating with the executable model without changing the executable model.

5. A computer-implemented method as in claim 4, further comprising:
    saving the electronic overlay and the second electronic overlay in separate files.

6. A computer-implemented method as in claim 1, further comprising:
    receiving a selection from the user, the selection to execute the executable model with the electronic overlay.

7. A computer-implemented method as in claim 1, further comprising:
    receiving a selection from the user, the selection to execute the executable model without the electronic overlay; and
    executing the executable model without the electronic overlay.

8. A computer-implemented method as in claim 1, further comprising:
    receiving another electronic markup in the electronic overlay, wherein the another electronic markup does not affect the functionality of the at least one executable element contained in the executable model.

9. A computer-implemented method as in claim 8, further comprising:
    executing the executable model with the electronic overlay, wherein the electronic markup affects the functionality of the at least one executable element contained in the executable model and the another electronic markup does not affect the functionality of the at least one executable element contained in the executable model.

10. A computer-implemented method as in claim 1, further comprising:
    associating a window with the electronic overlay; and
    receiving another electronic markup in the window, wherein another electronic markup changes the executable model.

11. A computer-implemented method as in claim 1, further comprising:
    managing the electronic overlay associated with the executable model with a version control system.

12. A computer-implemented method as in claim 1, wherein the electronic markup is received via a remote access connection.

13. A computer-implemented method as in claim 1, wherein receiving an electronic markup is based on user privileges.

14. A computer-implemented method as in claim 1, further comprising:
    merging the electronic markup with the executable model.

15. A computer-implemented method as in claim 1, further comprising:
    anchoring the electronic markup to a functional element of the executable model.

16. A computer-implemented method as in claim 1, further comprising:
    anchoring the electronic markup to another electronic markup of the executable model.

17. A computer-implemented method as in claim 1, further comprising:
    saving the electronic overlay with the executable model.

18. A computer-implemented method as in claim 1, further comprising:
    saving the electronic overlay independently from the executable model.

19. A computer-implemented method as in claim 1, wherein the executable model is a non-graphical executable model.

20. A computer-implemented method for marking-up an executable model as in claim 1, comprising:
    downloading software to a computer system, which when executed by the computer system causes the computer system to perform operations comprising the method of claim 1.

21. A computer-implemented method for marking-up an executable model as in claim 1, comprising:

providing downloadable software to a computer system, which when executed by the computer system causes the computer system to perform operations comprising the method of claim 1.

22. A computer-readable medium comprising software, which when executed by a computer system causes the computer system to perform operations for marking-up an executable model in an executable modeling environment, the operations comprising:
  displaying the executable model to a user, wherein the executable model contains at least one executable element;
  associating an electronic overlay with the executable model, the electronic overlay operating with the executable model without changing the executable model;
  receiving an electronic markup in the electronic overlay, wherein the electronic markup affects the functionality of the at least one executable element contained in the executable model when the electronic markup is executed with the executable model;
  displaying the electronic markup in the electronic overlay; and
  executing, using a processing device, the executable model with the electronic overlay, wherein the electronic markup in the electronic overlay affects the functionality of the at least one executable element contained in the executable model during execution of the executable model.

23. A computer-readable medium as in claim 22, wherein the electronic markup is free-form electronic markup.

24. A computer-readable medium as in claim 22, wherein the electronic markup is functional element electronic markup.

25. A computer-readable medium as in claim 22, further comprising:
  associating a second electronic overlay with the executable model, the second electronic overlay operating with the executable model without changing the executable model.

26. A computer-readable medium as in claim 25, further comprising:
  saving the electronic overlay and the second electronic overlay in separate files.

27. A computer-readable medium as in claim 22, further comprising:
  receiving a selection from the user, the selection to execute the executable model with the electronic overlay.

28. A computer-readable medium as in claim 22, further comprising:
  receiving a selection from the user, the selection to execute the executable model without the electronic overlay; and
  executing the executable model without the electronic overlay.

29. A computer-readable medium as in claim 22, further comprising:
  receiving another electronic markup in the electronic overlay, wherein the another electronic markup does not affect the functionality of the at least one executable element contained in the executable model.

30. A computer-readable medium as in claim 29, further comprising:
  executing the executable model with the electronic overlay, wherein the electronic markup affects the functionality of the at least one executable element contained in the executable model and the another electronic markup does not affect the functionality of the at least one executable element contained in the executable model.

31. A computer-readable medium as in claim 22, further comprising:
  associating a window with the electronic overlay; and
  receiving another electronic markup in the window, wherein another electronic markup changes the executable model.

32. A computer-readable medium as in claim 22, further comprising:
  managing the electronic overlay associated with the executable model with a version control system.

33. A computer-readable medium as in claim 22, wherein the electronic markup is received via a remote access connection.

34. A computer-readable medium as in claim 22, wherein receiving an electronic markup is based on user privileges.

35. A computer-readable medium as in claim 22, further comprising:
  merging the electronic markup with the executable model.

36. A computer-readable medium as in claim 22, further comprising:
  anchoring the electronic markup to a functional element of the executable model.

37. A computer-readable medium as in claim 22, further comprising:
  anchoring the electronic markup to another electronic markup of the executable model.

38. A computer-readable medium as in claim 22, further comprising:
  saving the electronic overlay with the executable model.

39. A computer-readable medium as in claim 22, further comprising:
  saving the electronic overlay independently from the executable model.

40. A system for marking-up an executable model in an executable modeling environment, comprising:
  means for displaying the executable model to a user, wherein the executable model contains at least one executable element;
  means for associating an electronic overlay with the executable model, the electronic overlay operating with the executable model without changing the content of the executable model;
  means for receiving an electronic markup in the electronic overlay, wherein the markup affects the functionality of the at least one executable element contained in the executable model when the electronic markup is executed with the executable model;
  means for displaying the electronic markup in the electronic overlay; and
  means for executing, using a processing device, the executable model with the electronic overlay, wherein the electronic markup in the electronic overlay affects the functionality of the at least one executable element contained in the executable model during execution of the executable model.

41. A computer-implemented method for marking-up an executable model in an executable modeling environment, comprising:
  displaying the executable model to a user, wherein the executable model includes at least one executable element;
  associating an electronic overlay with the executable model, the electronic overlay operating with the executable model without changing the executable model;
  associating a window with the electronic overlay;
  receiving a first electronic markup in the electronic overlay, wherein the first electronic markup does not change the executable model but affects the functionality of the at least one executable element included in the executable model when the electronic markup in the electronic overlay is executed with the executable model;

receiving a second electronic markup in the window, wherein the second electronic markup changes the executable model;

displaying the first electronic markup in the electronic overlay or the second electronic markup in the window; and executing, using a processing device, the changed executable model with the electronic overlay, wherein the first electronic markup in the electronic overlay affects the functionality of the at least one executable element included in the executable model when the executable model is executed.

42. A computer-readable medium comprising software, which when executed by a computer system causes the computer system to perform operations for marking-up an executable model in an executable modeling environment, the operations comprising:

displaying the executable model to a user, wherein the executable model includes at least one executable element;

associating an electronic overlay with the executable model, the electronic overlay operating with the executable model without changing the executable model;

associating a window with the electronic overlay;

receiving a first electronic markup in the electronic overlay, wherein the first electronic markup does not change the executable model but affects the functionality of the at least one executable element included in the executable model when the electronic markup in the electronic overlay is executed with the executable model;

receiving a second electronic markup in the window, wherein the second electronic markup changes the executable model;

displaying the first electronic markup in the electronic overlay or the second electronic markup in the window; and executing, using a processing device, the changed executable model with the electronic overlay, wherein the first electronic markup in the electronic overlay affects the functionality of the at least one executable element included in the executable model when the executable model is executed.

43. A system for marking-up an executable model in an executable modeling environment, comprising:

means for displaying the executable model to a user, wherein the executable model includes at least one executable element;

means for associating an electronic overlay with the executable model, the electronic overlay operating with the executable model without changing the executable model;

means for associating a window with the electronic overlay;

means for receiving a first electronic markup in the electronic overlay, wherein the first electronic markup does not change the executable model but affects the functionality of the at least one executable element included in the executable model when the first electronic markup in the electronic overlay is executed with the executable model;

means for receiving a second electronic markup in the window, wherein the second electronic markup changes the executable model;

means for displaying the first electronic markup in the electronic overlay or the second electronic markup in the window; and means for executing, using a processing device, the changed executable model with the electronic overlay, wherein the first electronic markup in the electronic overlay affects the functionality of the at least one executable element included in the changed executable model when the executable model is executed.

44. A computer-implemented method for marking-up an executable model in an executable modeling environment, comprising:

displaying the executable model within the executable modeling environment to a user, wherein the executable model has at least one executable element;

associating a first electronic overlay with the executable model, the first electronic overlay operating with the executable model without changing the executable model;

receiving a first electronic markup in the first electronic overlay, wherein the first electronic markup affects the functionality of the at least one executable element of the executable model when the first electronic markup is executed with the executable model;

associating a second electronic overlay with the executable model, the second electronic overlay operating with the executable model without changing the executable model;

receiving a second electronic markup in the second electronic overlay, wherein the second electronic markup affects the functionality of the at least one executable element of the executable model when the second electronic markup is executed with the executable model;

displaying the executable model with the first electronic overlay, the second electronic overlay, or the first and second electronic overlay; and executing, using a processing device, the executable model with:

the first electronic overlay, wherein the first electronic markup in the first electronic overlay affects the functionality of the at least one executable element of the executable model when the executable model is executed;

the second electronic overlay, wherein the second electronic markup in the second electronic overlay affects the functionality of the at least one executable element of the executable model during execution of the executable model; or the first and the second electronic overlay, wherein the first electronic markup in the first electronic overlay affects the functionality of the at least one executable element of the executable model when the executable model is executed, wherein the second electronic markup in the second electronic overlay affects the functionality of the at least one executable element of the executable model when the executable model is executed.

45. A computer-implemented method as in claim 44, further comprising:

saving the electronic overlay and the second electronic overlay in separate files.

46. A computer-readable medium comprising software, which when executed by a computer system causes the computer system to perform operations for marking-up an executable model in an executable modeling environment, the operations comprising:

displaying the executable model within the executable modeling environment to a user, wherein the executable model has at least one executable element;

associating a first electronic overlay with the executable model, the first electronic overlay operating with the executable model without changing the executable model;

receiving a first electronic markup in the first electronic overlay, wherein the first electronic markup affects the functionality of the at least one executable element contained in the executable model when the first electronic markup is executed with the executable model;

associating a second electronic overlay with the executable model, the second electronic overlay operating with the executable model without changing the executable model;

receiving a second electronic markup to the executable model in the second electronic overlay, wherein the second electronic markup affects the functionality of the at least one executable element of the executable model when the second electronic markup is executed with the executable model;

displaying the executable model with the first electronic overlay, the second electronic overlay, or the first and second electronic overlay; and executing, using a processing device, the executable model with:

the first electronic overlay, wherein the first electronic markup in the first electronic overlay affects the functionality of the at least one executable element of the executable model during execution of the executable model;

the second electronic overlay, wherein the second electronic markup in the second electronic overlay affects the functionality of the at least one executable element of the executable model during execution of the executable model; or the first and the second electronic overlay, wherein the first electronic markup in the first electronic overlay affects the functionality of the at least one executable element of the executable model during execution of the executable model, wherein the second electronic markup in the second electronic overlay affects the functionality of the at least one executable element of the executable model during execution of the executable model.

47. A computer-implemented method as in claim 46, further comprising: saving the electronic overlay and the second electronic overlay in separate files.

48. A system for marking-up an executable model in an executable modeling environment, comprising:

means for displaying the executable model within the executable modeling environment to a user, wherein the executable model has at least one executable element;

means for associating a first electronic overlay with the executable model, the first electronic overlay operating with the executable model without changing the executable model;

means for receiving a first electronic markup in the first electronic overlay, wherein the first electronic markup affects the functionality of the at least one executable element of the executable model when the first electronic markup is executed with the executable model;

means for associating a second electronic overlay with the executable model, the second electronic overlay operating with the executable model without changing the executable model;

means for receiving a second electronic markup in the second electronic overlay, wherein the second electronic markup affects the functionality of the at least one executable element of the executable model when the second electronic markup is executed with the executable model;

means for displaying the executable model with the first electronic overlay, the second electronic overlay, or the first and second electronic overlay; and means for executing, using at least one processing device, the executable model with:

the first electronic overlay, wherein the first electronic markup in the first electronic overlay affects the functionality of the at least one executable element of the executable model during execution of the executable model;

the second electronic overlay, wherein the second electronic markup in the second electronic overlay affects the functionality of the at least one executable element of the executable model during execution of the executable model; or the first and the second electronic overlay, wherein the first electronic markup in the first electronic overlay affects the functionality of the at least one executable element of the executable model during execution of the executable model, wherein the second electronic markup in the second electronic overlay affects the functionality of the at least one executable element of the executable model during execution of the executable model.

49. A computer-readable medium comprising software, which when executed by a computer system causes the computer system to perform operations for marking-up an executable model in an executable modeling environment, the operations comprising:

associating a first electronic overlay, containing at least one electronic markup, with the executable model, where the overlay includes information about the at least one electronic markup, wherein the executable model contains at least one executable element, wherein the at least one electronic markup affects the functionality of the at least one executable element contained in the executable model when the at least one electronic markup is executed with the executable model;

executing, using a processing device, the executable model with the overlay, where the executing affects the functionality of the at least one executable element contained in the executable model based on the at least one electronic markup; and displaying a result to a user, where the result is produced by executing the model based on the affected functionality.

* * * * *